(12) United States Patent
Song et al.

(10) Patent No.: US 12,092,676 B2
(45) Date of Patent: Sep. 17, 2024

(54) SEMICONDUCTOR DEVICE AND METHOD FOR IMPROVED ANTENNA TESTING

(71) Applicant: JCET STATS ChipPAC Korea Limited, Incheon (KR)

(72) Inventors: JinHyeok Song, Incheon (KR); DeokWoo Nam, Incheon (KR); YoungEun Seo, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 0 days.

(21) Appl. No.: 17/935,840

(22) Filed: Sep. 27, 2022

(65) Prior Publication Data

US 2024/0103058 A1    Mar. 28, 2024

(51) Int. Cl.
*G01R 29/08*      (2006.01)

(52) U.S. Cl.
CPC ..... *G01R 29/0878* (2013.01); *G01R 29/0892* (2013.01)

(58) Field of Classification Search
CPC ................. G01R 29/0878; G01R 29/0892
See application file for complete search history.

(56) References Cited

U.S. PATENT DOCUMENTS

| | | | |
|---|---|---|---|
| 7,876,276 B1 | 1/2011 | Zaman et al. | |
| 8,201,338 B2 | 6/2012 | Tsai et al. | |
| 10,602,385 B1 | 3/2020 | Jones | |
| 10,838,004 B2 | 11/2020 | Schnattinger et al. | |
| 2011/0043418 A1* | 2/2011 | Teshirogi | H04B 17/327 343/703 |
| 2019/0356397 A1* | 11/2019 | DaSilva | H04B 17/17 |
| 2020/0386802 A1* | 12/2020 | Wang | H04B 17/102 |

FOREIGN PATENT DOCUMENTS

CN      110095658 A  *  8/2019  ......... G01R 29/0871

OTHER PUBLICATIONS

Paulsen et al_CN_110095658_A_2019_Machine Translation (Year: 2019).*

* cited by examiner

*Primary Examiner* — Eman A Alkafawi
*Assistant Examiner* — Suresh K Rajaputra
(74) *Attorney, Agent, or Firm* — Brian M. Kaufman; Robert D. Atkins; PATENT LAW GROUP: Atkins and Associates, P.C.

(57) ABSTRACT

A semiconductor device is tested by disposing an antenna-in-package (AiP) module under a test antenna. A first signal is transmitted with a first antenna of the AiP module. The test antenna is moved to a power output peak of the first signal. A second signal is transmitted with a second antenna of the AiP module. The test antenna is moved along a first directional axis from the power output peak of the first signal to a power output peak of the second signal while a second directional axis of the test antenna is held static. The first antenna of the AiP module is tested while the test antenna is at the power output peak of the first signal. The second antenna of the AiP module is tested while the test antenna is at the power output peak of the second signal.

23 Claims, 5 Drawing Sheets

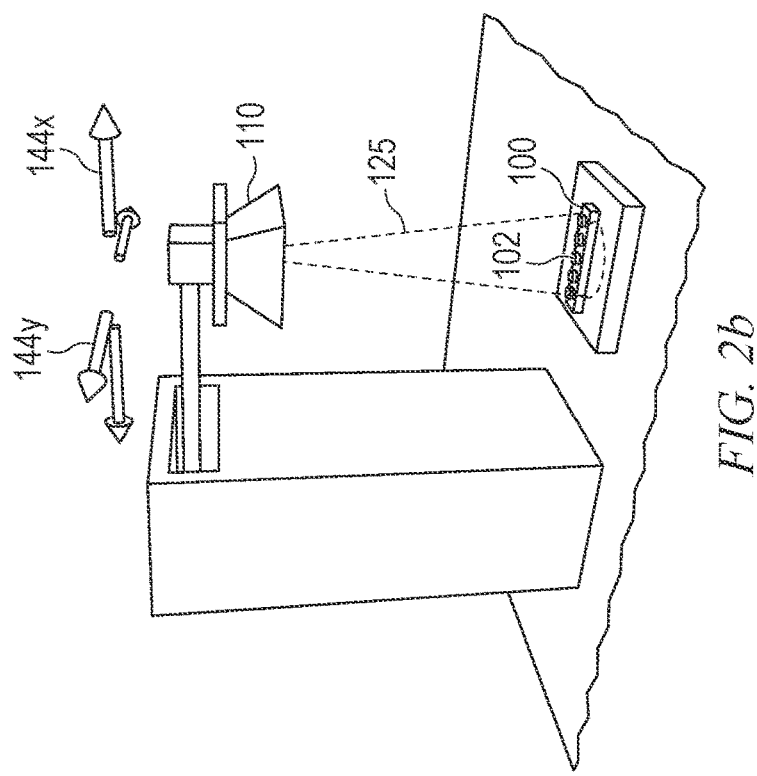
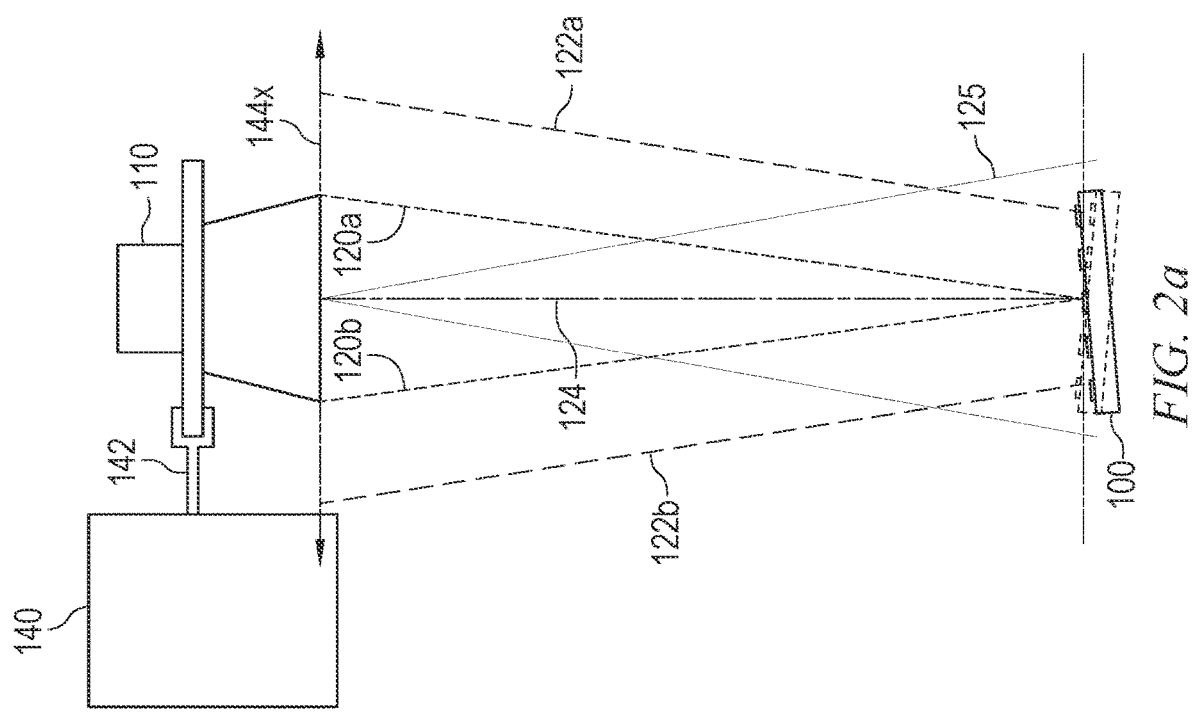

SEMICONDUCTOR DEVICE AND METHOD FOR IMPROVED ANTENNA TESTING

FIELD OF THE INVENTION

The present invention relates in general to semiconductor devices and, more particularly, to a semiconductor device and method for improved antenna testing.

BACKGROUND OF THE INVENTION

Today's advanced communication technologies demand higher performance in smaller packages. As more and more devices demand to connect to wireless networks, multi-input multi-output (MIMO) technology is used to increase capacity. However, MIMO antennae increase complexity of semiconductor packages even further.

Testing of semiconductor packages with integrated antennae is an important part of the manufacturing process. However, with smaller MIMO packages, small misalignments of the package with testing equipment cause significant errors in test results. Packages under test are manually placed into the test equipment. A beam angle deviation of up to 5 degrees is not uncommon when placed using a manual procedure. As a result, the test antenna being used is commonly placed outside of the half power beam width (HPBW) of one or more antennae of the MIMO package, causing flawed testing results.

Therefore, a need exists for an improved semiconductor device and method for improved antenna testing.

BRIEF DESCRIPTION OF THE DRAWINGS

FIGS. 2a and 2b illustrate a motorized fixture to automatically adjust for manual placement errors during testing;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "semiconductor die" and "die" are used interchangeably.

Figure 1B:
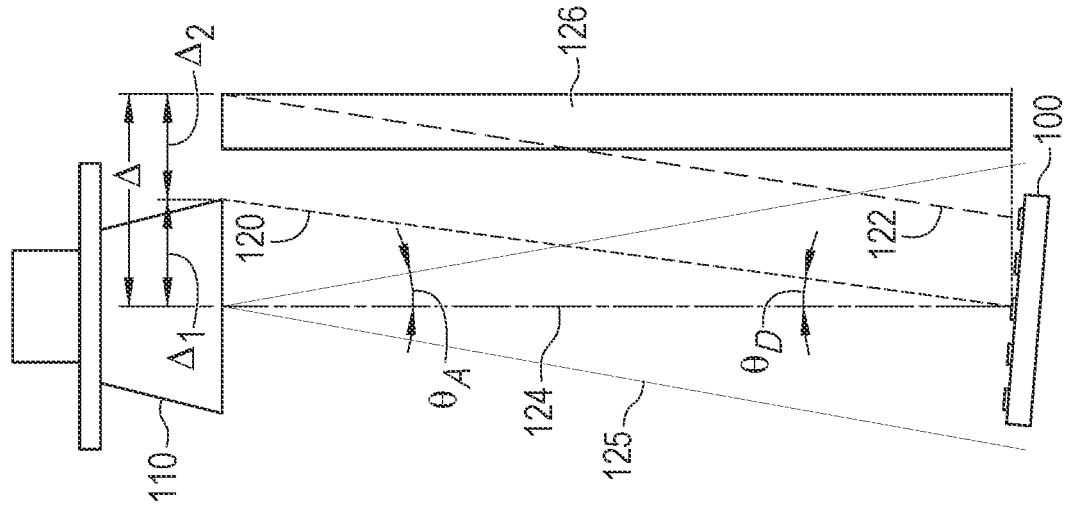
FIGS. 1a and 1b illustrate testing an antenna-in-package module.
Figure 1A:
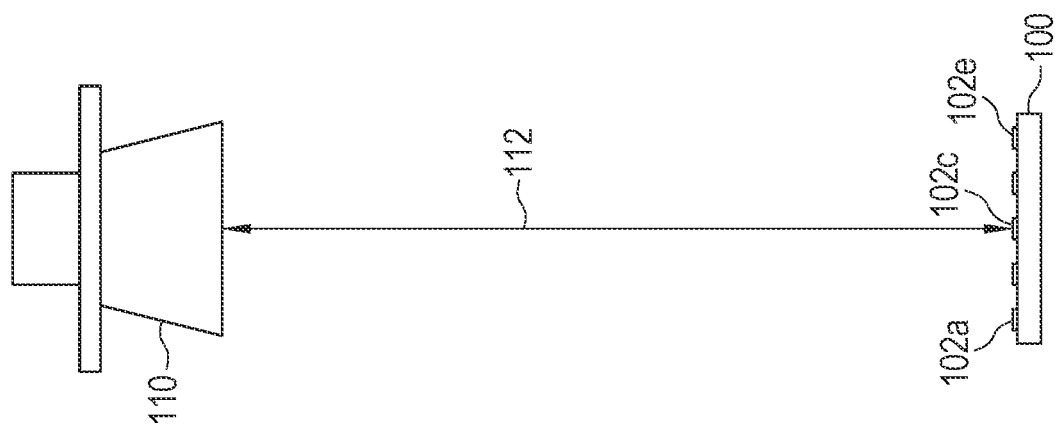

FIG. 1a shows an antenna-in-package (AiP) 100 under test as part of the manufacturing process. AiP 100 is a semiconductor package with antennae 102 integrated as part of the package. Any type or style of semiconductor package can operate as an AiP if there is one or more antenna incorporated into the package. AiP 100 includes one or more semiconductor die to operate the antennae as well as any discrete active or passive devices required for amplification, filtering, and other manipulation of radio frequency (RF) signals. In other embodiments, antennae 102 are manufactured as a part of a separate module connected, attached, or mounted to another semiconductor package for control.

AiP 100 is a MIMO package, with five antennae 102a-102e formed on a single package. To test AiP 100 and confirm that antennae 102a-102e are operating properly, the AiP is placed under a test antenna 110. Test antenna 110 communicates with AiP 100 wirelessly via radio frequency (RF) emissions, as illustrated by arrow 112, via each antennae 102a-102e to ensure that all of the antennae were manufactured properly. Antennae 102a-102e are tested one at a time to isolate each individual antenna during testing.

One problem that may occur when AiP 100 is placed under test antenna 110 is that the AiP may not lay perfectly flat on the underlying carrier or substrate as shown in FIG. 1b. In a lot of process flows, AiP 100 is placed manually by hand, which exacerbates issues relating to inconsistent placement. Line 120 in FIG. 1b illustrates the direction of max power broadcast by center antenna 102c, illustrating that the output of antenna 102c is off-center by the distance $\Delta_1$ by the time the signal reaches the height of test antenna 110. Test antenna 110 is still able to properly test center antenna 102c because the center of the test antenna is within the half power beam width (HPBW) of center antenna 102c. HPBW is the range of angles of antenna 102c wherein power received by test antenna 110 is at least half of the maximum possible. In FIG. 1b, HPBW is equal to $2*\theta_A$. In FIG. 1b, the angle of test antenna 110 relative to line 120, $\theta_D$, is the deviation due to the manual placement procedure of AiP 100. The angle $\theta_D$ is within the HPBW of antenna 102c, allowing the center antenna to be tested properly.

However, the lateral offset of rightmost antenna 102e, in combination with the angular offset of AiP 100 as a whole, places test antenna 110 outside of the HPBW for the rightmost antenna. Line 122 illustrates the highest power output angle for rightmost antenna 102e, and is pointed outside of test antenna 110 by $\Delta_2$. Line 122 is off-centered from test antenna 110 by a total distance $\Delta$, resulting in the HPBW of rightmost antenna 102e being completely outside of test antenna 110. Box 126 indicates the distance by which test antenna 110 is outside of the HPBW for the beam from rightmost antenna 102e.

Line 124 is the center line of signals broadcast from test antenna 110 and shows the direction at which broadcast power is highest for the test antenna. Cone 125 around line 124 shows the HPBW of test antenna 110. The point of cone 125 is the center of test antenna 110 and also the location where the HPBW of an antenna 102 under test must hit to be a valid test.

In one specific example for a 40 GHz signal, the HPBW coverage from an antenna 102 is 17.4 millimeters (mm) across at the elevation of test antenna 110. $\theta_A$ is the HPBW of test antenna 120 and each antenna 102, equal is 8.25 degrees. $\theta_D$ is the angle that AiP 100 is tilted by, equal to 5 degrees. $\Delta_1$ is 10.5 mm, $\Delta_2$ is 9.2 mm, and $\Delta$ is the sum at 19.7 mm. Box 126 illustrates how far test antenna 110 is outside of the HPBW of rightmost antenna 102e, 2.3 mm in this example. Rightmost antenna 102e is not able to be properly tested by test antenna 110 in FIG. 1b because the deviation of AiP 100 when being placed under the test antenna places the test antenna outside of the rightmost antenna's HPBW.

FIGS. 2a and 2b illustrate mounting test antenna 110 on a motorized fixture 140, which will allow the test antenna to be moved to account for an AiP 100 under test being placed with an angular or lateral displacement. FIG. 2a shows a two-dimensional view from the angle of FIG. 1b, while FIG. 2b illustrates a three-dimensional perspective view. Motorized fixture 140 includes an arm 142 that test antenna 110 is mounted onto. Motorized fixture 140 uses arm 142 to move test antenna 110 in the x and y directions, as represented by arrows 144x and 144y, respectively.

Lines 120a and 120b illustrate the expected extent of the signal from center antenna 102c with the maximum normally expected placement variances. Lines 122a and 122b show the corresponding broadcast direction for edge antennae 102a and 102e, respectively. Motorized fixture 140 is capable of moving test antenna 110 far enough to cover the maximum expected offset of each antenna 102a-102e in both the x and y directions.

Figure 3:
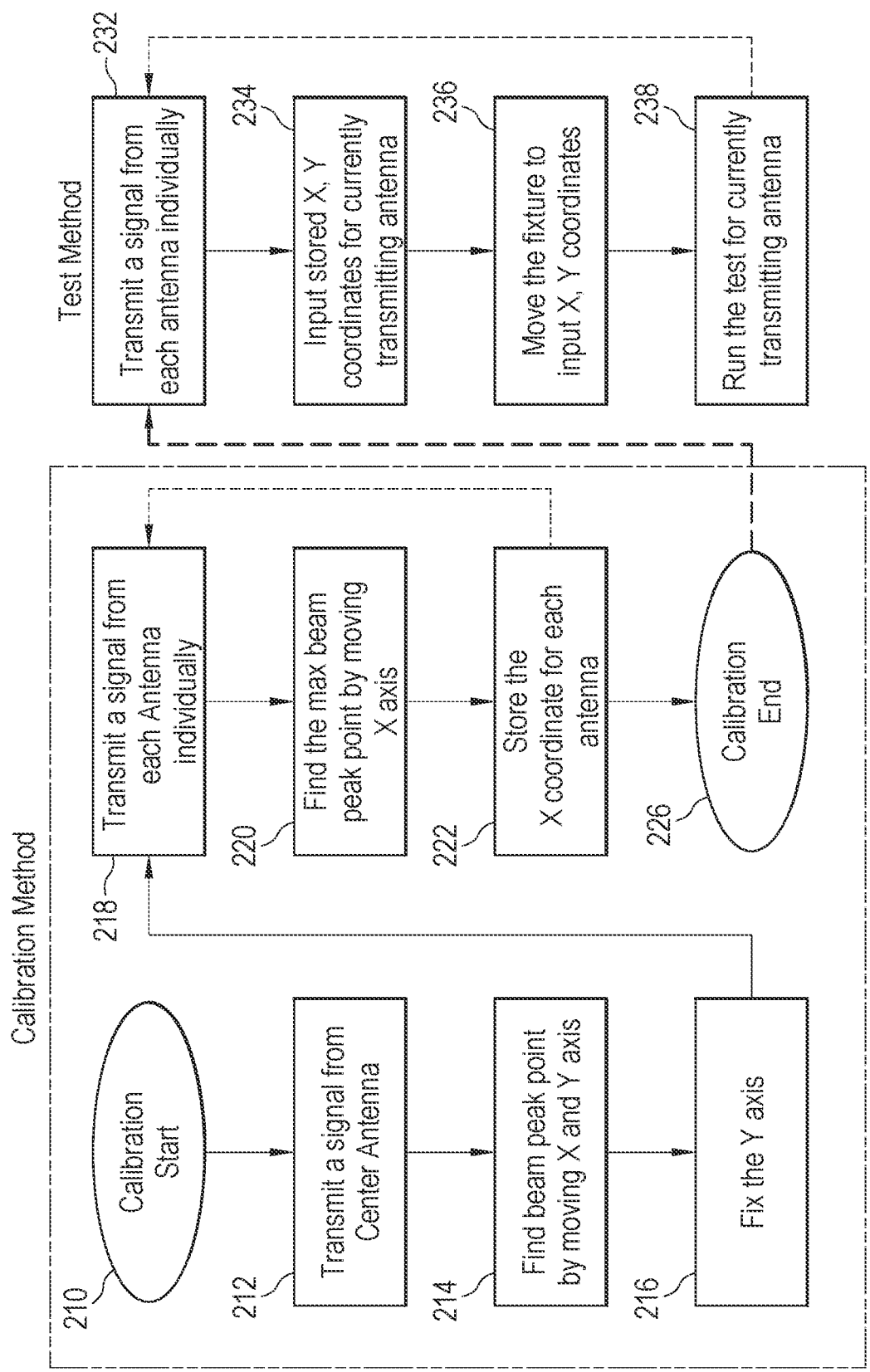
FIG. 3 illustrates process steps for utilizing the motorized fixture.

FIG. 3 shows process steps for a calibration method 200 and test method 230 used to test AiP 100 with test antenna 110 on motorized fixture 140. FIGS. 4a-4d illustrate various steps in calibration method 200 and test method 230. At calibration start 210, AiP 100 has been placed under test antenna 110 and may have an unknown angular offset relative to vertical. Step 212 involves transmitting a signal from center antenna 102c.

Figure 4A:
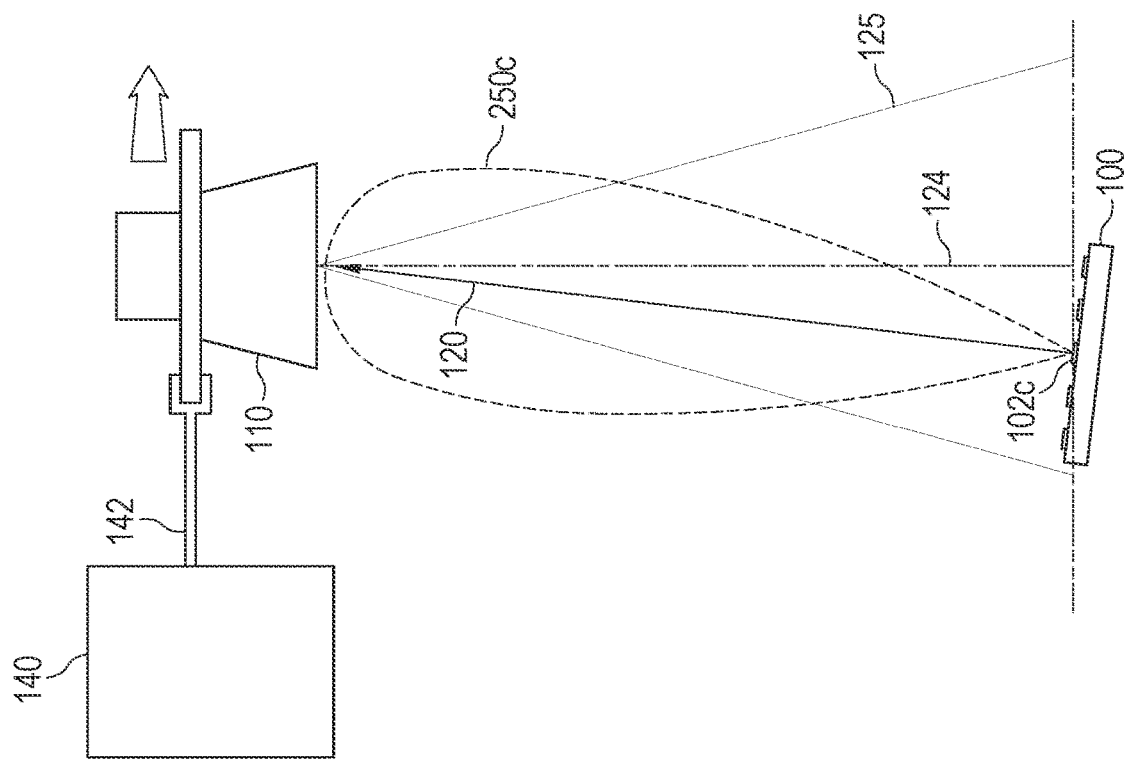
FIGS. 4a-4d illustrate usage of the motorized fixture according to the method of FIG. 3.

FIG. 4a shows steps 210 and 212. AiP 100 has been placed under test antenna 110 and has an unknown angular offset to the right. Signal lobe 250c represents the power from antenna 102c from the transmitted signal from step 212. The power is highest where indicated by arrow 120. Power is significantly less where test antenna 110 receives the signal at the point of cone 125.

Figure 4B:
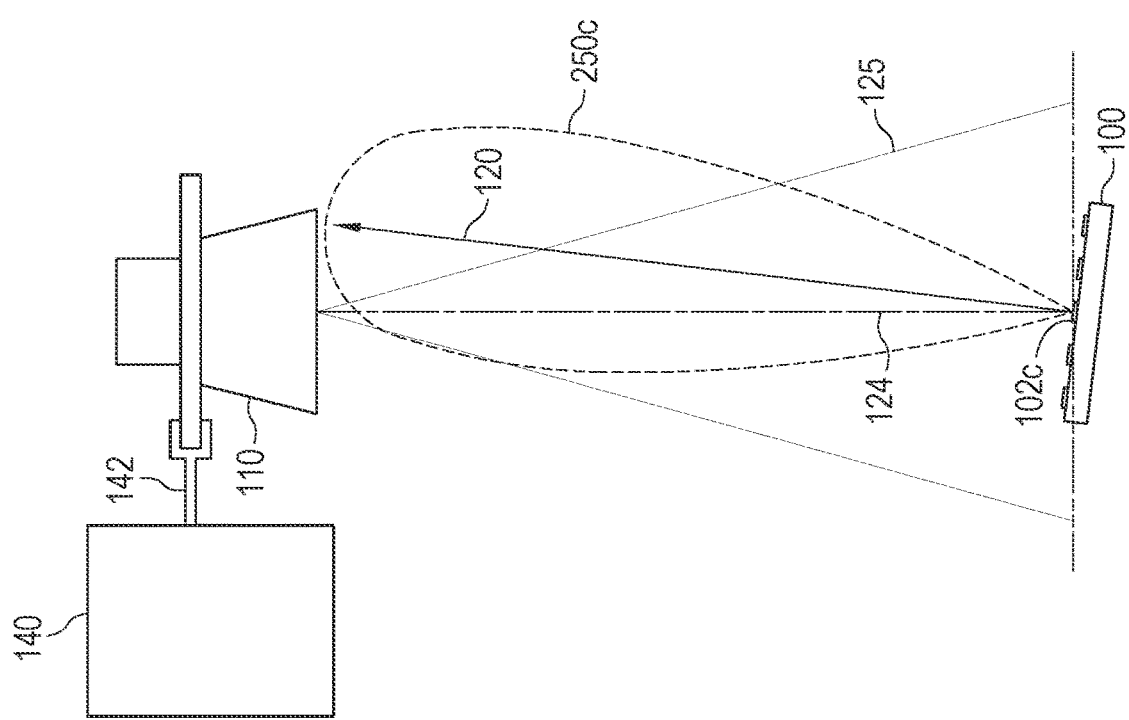

While the signal is being transmitted from center antenna 102c for step 212, step 214 commences. In step 214, motorized fixture 140 is programmatically moved until the peak point 120 of center antenna 102c is found. Motorized fixture 140 moves test antenna 110 and monitors the power level of the signal received from center antenna 102c. Test antenna 110 is moved in both the X and Y direction until a maximum power level is found along both axes. FIG. 4b shows test antenna 110 moved to the right to be centered over arrow 120, the highest power output location of broadcast lobe 250c. That X,Y coordinate location is stored as the power output peak location for center antenna 102c.

Because antennae 102a-102e are lined up along the X axis illustrated by line 144x in FIG. 2b, the Y coordinate for all antennae 102a-102e can be fixed to the value determined for center antenna 102c in step 216. The Y value can be stored once and reused for each antenna 102, or stored multiple times as part of a separate X,Y coordinate for each antenna.

After the X,Y coordinate for test antenna 110 to be centered over center antenna 102c has been determined, steps 218-222 are repeated for each remaining antenna 102a, 102b, 102d, and 102e. An individual antenna has a signal transmitted therefrom in step 218, similar to center antenna 102c transmitting in step 212. In step 220, the max beam peak point of the currently transmitting antenna is determined by keeping the Y coordinate of test antenna 110 static and only moving the test antenna along the X axis using motorized fixture 140. When the peak is found, the X coordinate of test antenna 110 at the peak is stored as the X coordinate for the currently transmitting antenna 102.

Figure 4C:
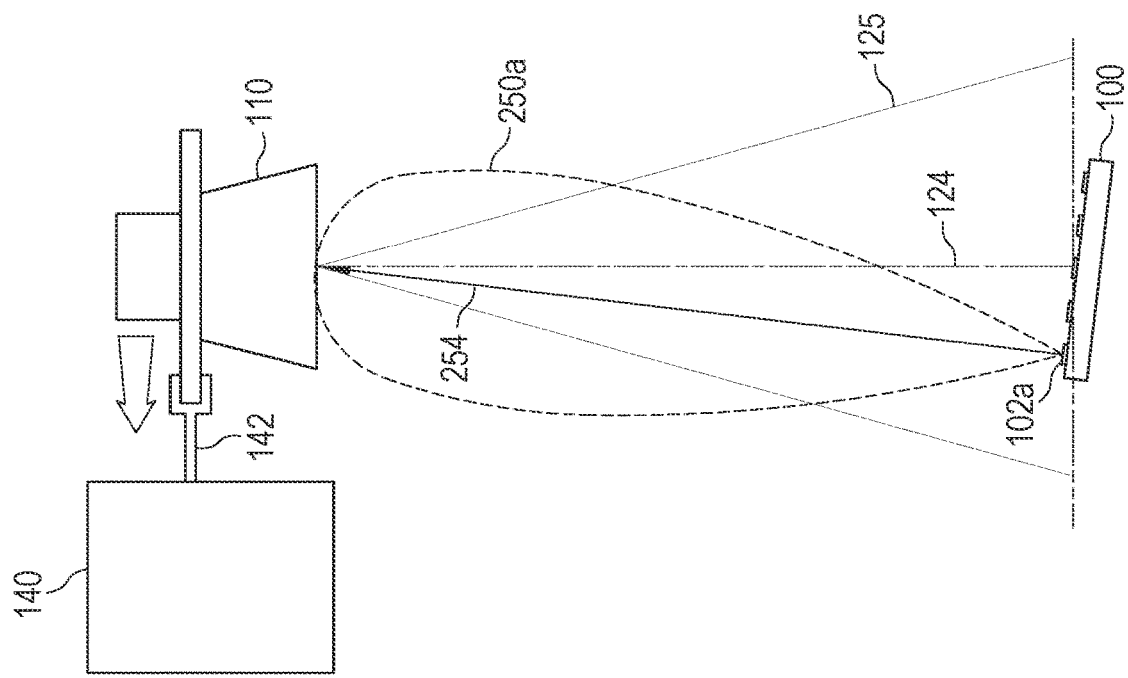

FIG. 4c shows steps 218-222 for rightmost antenna 102e. Lobe 250e represents the signal transmitted from antenna 102e, while arrow 252 indicates the maximum power direction. Test antenna 110 is moved along the x-axis only until the test antenna is centered over arrow 252, that being the maximum power output for antenna 102e. The x-coordinate of test antenna 110 is stored to indicate the location where antenna 102e is at maximum power.

Figure 4D:
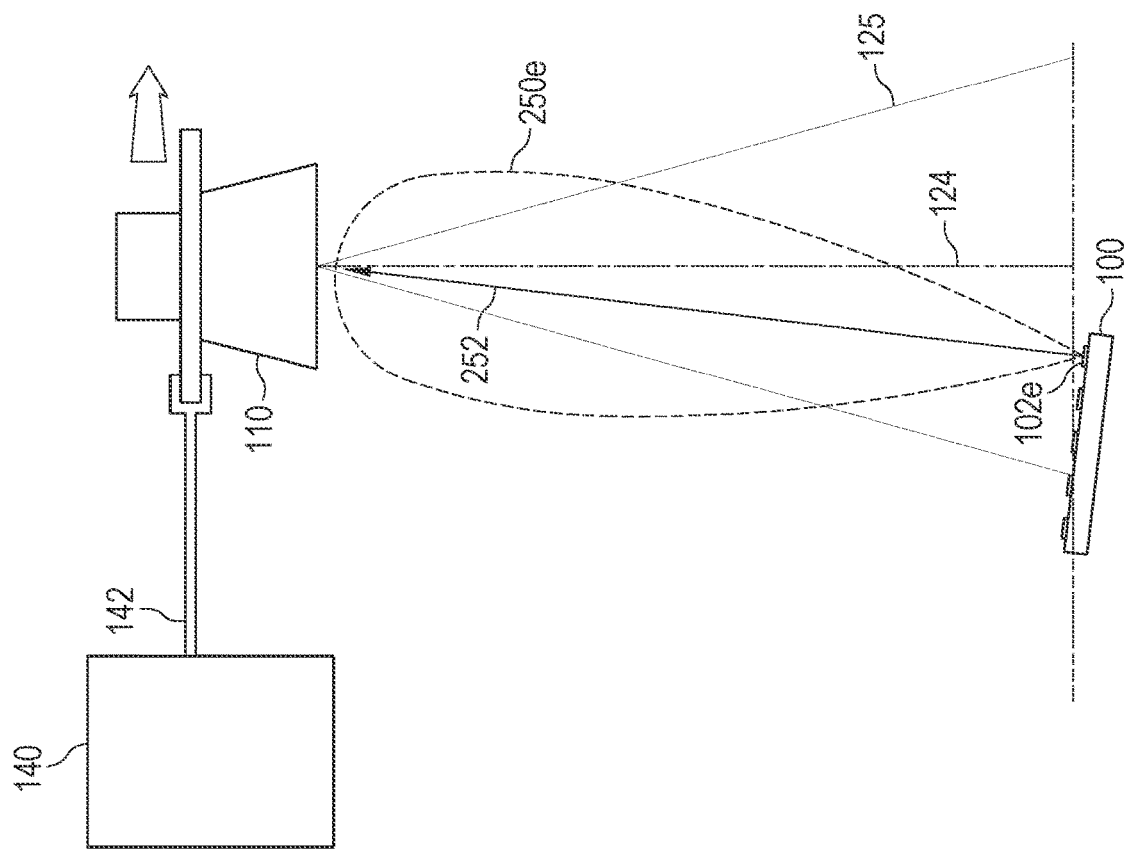

Steps 218-222 are repeated for each antenna 102 except for center antenna 102c. FIG. 4d shows repeating the steps for leftmost antenna 102a. Lobe 250a represents the power output of a signal transmitted from antenna 102a. Arrow 254 shows the direction of maximum power. Test antenna 110 is moved along the x-axis until the test antenna is centered over arrow 254. An X coordinate is stored for each antenna, and the Y coordinate determined for center antenna 102c is used for all antennae 102. Calibration ends at step 226 once an X coordinate for each antenna is determined and stored. In other embodiments, a different antenna is used as the baseline measurement in step 216. The baseline measurement does not need to use a centrally located antenna.

Typically, a computer program runs calibration method 200 automatically, including controlling which antenna 102a-102e is transmitting, moving test antenna 110, and monitoring a power level of the signal received by the test antenna to find the peak power signal. Saved coordinates determined by calibration method 200 are stored in memory by the computer program for recall during test method 230. Different levels of manual intervention may be required in other embodiments.

Calibration method 200 can be modified as needed for a specific AiP module under test. For instance, if there is not an odd number of antennae, then the initial antenna used for finding the Y axis in steps 212-216 may be off-centered. In embodiments where antennae 102 are not aligned linearly, steps 212-214 may be repeated, and steps 218-222 skipped, to acquire both a new X and Y coordinate for each antenna instead of reusing the Y coordinate in steps 218-220. AiP 100 may be placed with antennae 102 aligned in the Y direction, in which case a common X coordinate would be determined in step 214 and reused for each other antenna.

With coordinates for all five antennae 102a-102e stored, test method 230 can proceed to run a test for each individual antenna 102. Steps 232-238 are repeated five times, once to test each individual antenna 102a-102e. In step 232, a signal is transmitted from one of the five antennae 102a-102e. In step 234, the computer program running calibration method 200 and test method 230 inputs the X,Y coordinates for the currently transmitting antenna to motorized fixture 140. In response, motorized fixture 140 moves test antenna 110 to the indicated X,Y coordinates in step 236. Steps 234 and 236 to move test antenna 110 into the proper location for a test can be performed prior to beginning broadcast of a test signal in step 232. In step 238, test antenna 110 is used to test the currently transmitting antenna by receiving the signal transmitted in step 232. In some embodiments, the transmitted signal is modified a number of times in a test routine in step 238.

All five antennae 102a-102e are tested by repeating steps 232-238 five times, once per antenna. In some embodiments, steps 232-238 are combined with calibration steps 218-222 by running a test 238 for an antennae immediately after finding its X coordinate in step 222 rather than storing the coordinate to return later.

Finding and storing X,Y coordinates for each antenna 102 in calibration method 200, and then testing the antennae by moving test antenna 110 to the peak power location for each antenna allows valid testing even when AiP 100 is placed with an angular displacement from vertical. Inconsistent manual placement can be used for AiP 100 without harming the testing process.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of testing a semiconductor device, comprising:
    disposing an antenna-in-package (AiP) module under a test antenna of a testing system;
    calibrating the testing system by,
        transmitting a first signal with a first antenna of the AiP module,
        moving the test antenna to find a power output peak of the first signal,
        storing coordinates of the power output peak of the first signal for both a first directional axis and a second directional axis,
        discontinuing transmission of the first signal with the first antenna,
        transmitting a second signal with a second antenna of the AiP module after discontinuing transmission of the first signal with the first antenna,
        moving the test antenna along the first directional axis from the power output peak of the first signal to a power output peak of the second signal while a position of the test antenna along the second directional axis is held static, and
        storing only a first coordinate along the first directional axis for the power output peak of the second signal; and
    testing the AiP module after calibrating the testing system by,
        returning the test antenna to the stored coordinates for the power output peak of the first signal,
        testing the first antenna of the AiP module while the test antenna is at the power output peak of the first signal,
        moving the test antenna along the first directional axis to the stored first coordinate for the power output peak for the second signal, and
        testing the second antenna of the AiP module while the test antenna is at the power output peak of the second signal.

2. The method of claim 1, further including returning the test antenna to the power output peak of the first signal to test the first antenna after moving the test antenna to the power output peak of the second signal.

3. The method of claim 1, further including moving the test antenna using a motorized fixture comprising an arm holding the test antenna.

4. The method of claim 1, further including:
    transmitting a third signal with a third antenna of the AiP module; and
    moving the test antenna along the first directional axis to a power output peak of the third signal while the second directional axis of the test antenna is held static.

5. The method of claim 1, further including manually placing the AiP module under the test antenna.

6. A method of testing a semiconductor device, comprising:
    disposing an antenna-in-package (AiP) module under a test antenna;
    transmitting a first signal with a first antenna of the AiP module;
    moving the test antenna to a power output peak of the first signal;
    storing coordinates of the power output peak of the first signal for both a first directional axis and a second directional axis,
    discontinuing transmission of the first signal;
    transmitting a second signal with a second antenna of the AiP module after discontinuing transmission of the first signal;
    moving the test antenna along a first directional axis to a power output peak of the second signal while a second directional axis of the test antenna is held static; and
    storing only a first coordinate along the first directional axis for the power output peak of the second signal.

7. The method of claim 6, further including returning the test antenna to the power output peak of the first signal to test the first antenna after moving the test antenna to the power output peak of the second signal.

8. The method of claim 7, further including returning the test antenna to the power output peak of the second signal to test the second antenna after testing the first antenna.

9. The method of claim 6, further including moving the test antenna using a motorized fixture comprising an arm holding the test antenna.

10. The method of claim 6, further including:
    transmitting a third signal with a third antenna of the AiP module; and
    moving the test antenna along the first directional axis to a power output peak of the third signal while the second directional axis of the test antenna is held static.

11. The method of claim 6, further including manually placing the AiP module under the test antenna.

12. A method of testing a semiconductor device, comprising:
    disposing an antenna-in-package (AiP) module under a test antenna of a testing system;
    calibrating the testing system by,
        transmitting a first signal with a first antenna of the AiP module while a second antenna of the AiP module is not transmitting, and
        moving the test antenna to a power output peak of the first signal while the first antenna is transmitting the first signal and while the second antenna of the AiP module is not transmitting,
        discontinuing transmission of the first signal with the first antenna,
        transmitting a second signal with a second antenna of the AiP module after discontinuing transmission of the first signal with the first antenna, and
        moving the test antenna to a power output peak of the second signal while the second antenna is transmitting the second signal; and
    testing the AiP module after calibrating the testing system by,
        returning the test antenna to the power output peak of the first signal,
        testing the first antenna of the AiP module while the test antenna is at the power output peak of the first signal,
        moving the test antenna to the power output peak for the second signal, and
        testing the second antenna of the AiP module while the test antenna is at the power output peak of the second signal.

13. The method of claim 12, further including testing the first antenna while the test antenna is at the first power output peak of the first signal.

14. The method of claim 12, further including moving the test antenna using a motorized fixture comprising an arm holding the test antenna.

15. The method of claim 12, further including moving the test antenna along a first directional axis while holding the test antenna static along a second directional axis to locate power output peaks for a plurality of additional antennae of the AiP module.

16. The method of claim 15, further including:
   storing coordinates of the power output peak of the first signal for both the first directional axis and second directional axis; and
   storing only a first coordinate along the first directional axis for the power output peak of each of the additional antennae.

17. The method of claim 15, further including testing each of the additional antennae while the test antenna is aligned to the power output peak for a respective antenna.

18. The method of claim 12, further including manually placing the AiP module under the test antenna.

19. A semiconductor testing device, comprising:
   a motorized fixture;
   a test antenna mounted to an arm of the motorized fixture;
   an antenna-in-package (AiP) module disposed under the test antenna; and
   a computer configured to calibrate the testing system by,
      transmitting a first signal with a first antenna of the AiP module,
      moving the test antenna to find a power output peak of the first signal,
      storing coordinates of the power output peak of the first signal for both a first directional axis and a second directional axis,
      discontinuing transmission of the first signal with the first antenna,
      transmitting a second signal with a second antenna of the AiP module after discontinuing transmission of the first signal with the first antenna,
      moving the test antenna along the first directional axis from the power output peak of the first signal to a power output peak of the second signal while a position of the test antenna along the second directional axis is held static, and
      storing only a first coordinate along the first directional axis for the power output peak of the second signal;
   wherein the computer is configured to test the AiP module by,
      returning the test antenna to the stored coordinates for the power output peak of the first signal,
      testing the first antenna of the AiP module while the test antenna is at the power output peak of the first signal,
      moving the test antenna along the first directional axis to the stored first coordinate for the power output peak for the second signal, and
      testing the second antenna of the AiP module while the test antenna is at the power output peak of the second signal.

20. The semiconductor testing device of claim 19, further including an antenna-in-package (AiP) module disposed under the test antenna.

21. The semiconductor testing device of claim 19, wherein the test antenna is aligned to a power output peak of a first antenna of the AiP module.

22. The semiconductor testing device of claim 21, further including a pair of coordinates stored in memory defining the location of the test antenna over the power output peak of the first antenna.

23. The semiconductor testing device of claim 22, further including a single coordinate stored in memory defining a location of the test antenna while over a power output peak of a second antenna of the AiP module.

* * * * *